United States Patent [19]

Sakamoto

[11] Patent Number: 4,563,659
[45] Date of Patent: Jan. 7, 1986

[54] NOISE FILTER

[75] Inventor: Yukio Sakamoto, Fukui, Japan

[73] Assignee: Murata Manufacturing Co., Ltd., Japan

[21] Appl. No.: 516,743

[22] Filed: Jul. 25, 1983

[30] Foreign Application Priority Data

Jul. 28, 1982 [JP] Japan .............. 57-115471[U]
Jul. 28, 1982 [JP] Japan .............. 57-115472[U]

[51] Int. Cl.$^4$ ............................................. H03H 7/01
[52] U.S. Cl. ................................. 333/181; 333/182; 333/185
[58] Field of Search ............... 333/167, 168, 175–177, 333/181–185; 361/301–306

[56] References Cited

U.S. PATENT DOCUMENTS

| | | | |
|---|---|---|---|
| 2,270,169 | 1/1942 | Muller | 333/185 |
| 2,582,931 | 1/1952 | Kodama | 361/306 |
| 2,973,490 | 2/1961 | Schlicke | 333/182 |
| 3,086,149 | 4/1963 | Baron | 361/301 |
| 3,111,612 | 11/1963 | Lehmann | 361/301 |
| 4,320,364 | 3/1982 | Sakamoto et al. | 333/167 |

FOREIGN PATENT DOCUMENTS 49-26943 3/1974 Japan .

Primary Examiner—Marvin L. Nussbaum
Attorney, Agent, or Firm—Ostrolenk, Faber, Gerb & Soffen

[57] ABSTRACT

A noise filter includes a capacitor having first and second electrodes, first and second terminal legs extending from the first electrode, and third and fourth terminal legs extending from the second electrode. The first and second terminal legs adapted for the path of electric signal, and the third and fourth terminal legs adapted for the path of ground level. The noise filter further includes first and second tubes mounted on the first and second terminal legs, respectively, and third and fourth tubes mounted on the third and fourth terminal legs, respectively. Each of the first, second, third and fourth tubes is made of a magnetic material, whereby high frequency noise signals can be filtered when signals pass through the noise filter.

23 Claims, 20 Drawing Figures

NOISE FILTER

BACKGROUND OF THE INVENTION

1. Field of the Invention

The present invention relates to a noise filter and, more particularly, to a noise filter employing a 4-terminal capacitor for filtering noise signals having a high frequency, such as from several 100 KHz to several 100 MHz.

2. Description of the Prior Art

Lead lines for transmitting signals often pick up high frequency noise signals. For example, when the lead line is disposed near a source of a high frequency signal, it picks up the high frequency noise electro-magnetically. Also, when an electric circuit employs, example, a switching regulator that alternately makes and breaks a current path as a power source, electromagnet interference noise appears on a power supply line to the electric circuit, thereby causing various troubles in the electric circuit. To eliminate such high frequency noise, a noise filter defined by a 2-terminal capacitor, such as shown in FIG. 1, is generally connected between a power supply line A and a ground line B.

The 2-terminal capacitor of FIG. 1 constitutes a ceramic dielectric plate 1, a pair of electrodes 2 and 3 deposited on opposite surfaces of the plate 1, respectively, a pair of terminal legs 4 and 5 extending from the electrodes 2 and 3, respectively, and a synthetic resin coating 6 covering the capacitor for insulation purposes. An equivalent circuit of the 2-terminal capacitor of FIG. 1, when it is connected between the power line A and ground line B, is shown in FIG. 2, in which a capacitor C1 represents capacitance between the electrodes 2 and 3, while inductors L4 and L5 represent inductances of the terminal legs 4 and 5, respectively. When the signals having various frequencies are transmitted through the power line A, a signal having a certain high frequency is filtered to ground through an L-C filter circuit including the capacitor C1 and inductors L4 and L5, while the remaining signals are transmitted through the power line A without any disturbances. The frequency of the signal filtered through the L-C circuit is determined by both the capacitance and inductance between the lines A and B. Accordingly, the inductance of the terminal legs 4 and 5 greatly influences the determination of the signal that can be filtered through the L-C circuit. From the view point of practice, the inductance in the L-C circuit should preferably be as low as possible. However, in the 2-terminal capacitor of FIG. 1, the inductors L4 and L5 have such a high inductance that only signals having a considerably low frequency as compared with that of the high frequency noise are filtered. Therefore, the high frequency noise signals can not be effectively filtered by the 2-terminal capacitor of FIG. 1.

To improve the filtering effect, a noise filter defined by a 4-terminal capacitor shown in FIG. 3 has been proposed. The 4-terminal capacitor of FIG. 3 has a ribbon-shaped terminal member 7 soldered to the electrode 2 and another ribbon-shaped terminal 8 soldered to the electrode 3. When in use, the ribbon-shaped terminal member 7 is connected in series with the power lead line A, while the other ribbon-shaped terminal member 8 is connected in series with the ground lead line B. An equivalent circuit of the 4-terminal capacitor of FIG. 3 is shown in FIG. 4 in which inductors L7' and L7" represent inductances in the wing portions of the ribbon-shaped terminal member 7, and inductors L8' and L8" represent inductances in the wing portions of the ribbon-shaped terminal member 8. As understood from the equivalent circuit of FIG. 4, no inductance, but only a capacitance 10 is present between the lines A and B.

Although the 4-terminal capacitor of FIG. 3 filters high frequency noise signals, the filtering effect is not sufficient particularly when noise signals have a high frequency, such as from several 100 KHz to several 100 MHz, as caused, for example , by the employment of a switching regulator.

SUMMARY OF THE INVENTION

The present invention has been developed with a view to substantially solving the above described disadvantages and has for its essential object to provide an improved noise filter of 4-terminal capacitor, capable of eliminating noise signals of a wide frequency range.

It is also an essential object of the present invention to provide a noise filter of 4-terminal capacitor of the above described type which is compact in size and can readily be manufactured at a low cost.

In accomplishing these and other objects of the present invention, a noise filter according to the present invention comprises a capacitor having first and second electrodes, first and second terminal legs extending from the first electrode, and third and fourth terminal legs extending from the second electrode. The first and second terminal legs adapted for the path of electric signal, and the third and fourth terminal legs adapted for the path of ground level.

The noise filter according to the present invention further comprises first and second tube means mounted on the first and second terminal legs, respectively, and third and fourth tube means mounted on the third and fourth terminal legs, respectively. Each of the first, second, third and fourth tube means is made of a magnetic material, whereby high frequency noise signals can be filtered when signals pass through the noise filter.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DESCRIPTION OF THE PREFERRED EMBODIMENTS

Figure 1:
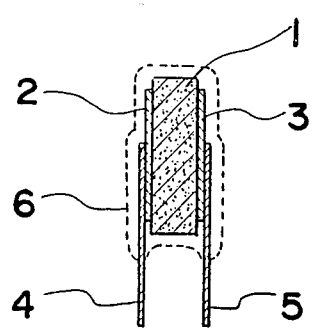
FIG. 1 is a cross-sectional view of a noise filter defined by a 2-terminal capacitor according to the prior art.
Figure 2:
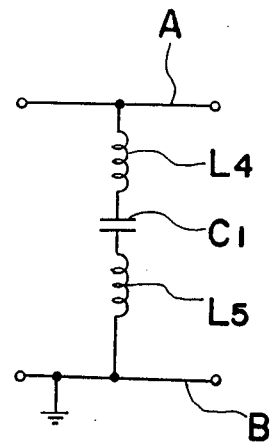
FIG. 2 is an equivalent circuit of the 2-terminal capacitor of FIG. 1.
Figure 3:
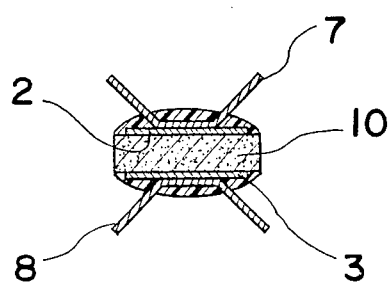
FIG. 3 is a cross-sectional view of a noise filter defined by a 4-terminal capacitor according to the prior art.
Figure 4:
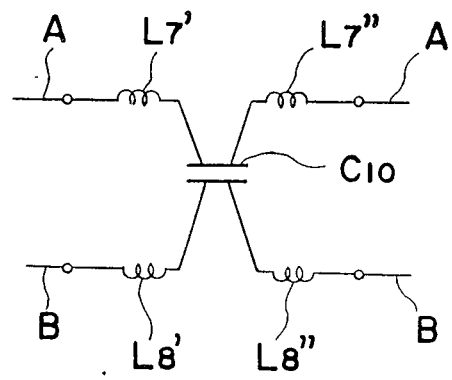
FIG. 4 is an equivalent circuit of the 4-terminal capacitor of FIG. 3.
Figure 5:
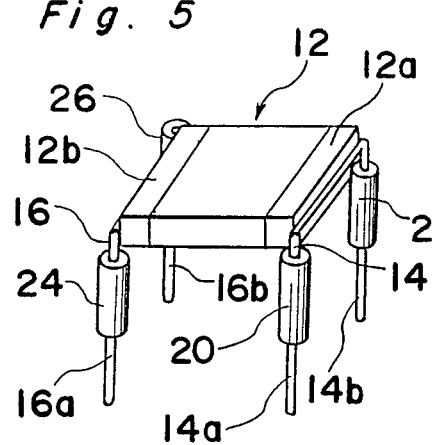
FIG. 5 is a perspective view of a noise filter defined by a 4-terminal capacitor according to a first embodiment of the present invention.

Referring to FIG. 5, a noise filter according to the first embodiment of the present invention comprises a chip shaped multi-layer capacitor 12 having electrodes 12a and 12b deposited at opposite ends thereof. A U-shaped terminal pin 14 is soldered to the electrode 12a, and another U-shaped terminal pin 16 is soldered to the other electrode 12b, such that the opposite end portions 14a and 14b (hereinafter also referred to as terminal legs) of the U-shaped terminal pin 14 and the opposite end portions 16a and 16b (hereinafter also referred to as terminal legs) of the U-shaped terminal pin 16 extend substantially downwardly and parallel to each other from the four corners of the chip shaped capacitor 12.

The four terminal legs 14a, 14b, 16a and 16b are mounted with tubes 20, 22, 24 and 26, respectively, each tube made of a material having a high permeability. To fixedly hold the tube on each terminal leg, a suitable bonding agent may be applied between the tube and the terminal leg.

Figure 6:
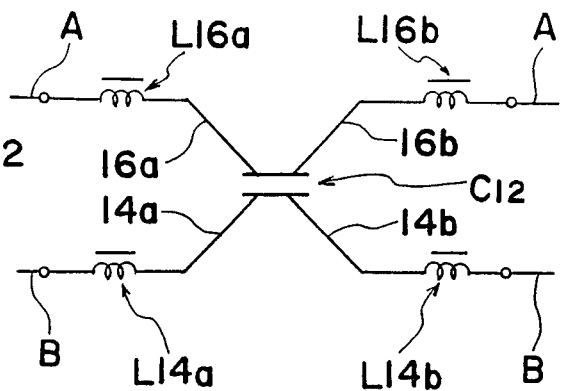
FIG. 6 is an equivalent circuit of the 4-terminal capacitor of FIG. 5.

Referring to FIG. 6, an equivalent circuit of the noise filter of FIG. 5 is shown. In FIG. 6, a capacitor C12 represents a capacitance between the electrodes 12a and 12b, while inductors L14a, L14b, L16a and L16b represent inductances of the terminal legs 14a, 14b, 16a and 16b, respectively.

Figure 7:
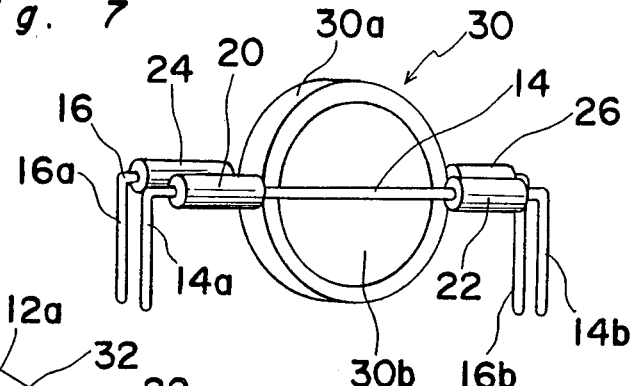
FIG. 7 is a perspective view of a noise filter defined by a 4-terminal capacitor according to a second embodiment of the present invention.

Referring to FIG. 7, a noise filter according to a second embodiment of the present invention is shown, and which comprises a disc shaped ceramic capacitor 30 defined by a disc shaped ceramic body 30a and electrodes 30b and 30c (the electrode 30c is not shown). According to the second embodiment, each of the U-shaped terminal pins 14 and 16 is arranged wider than the first embodiment such that the tube 20 is mounted not on the terminal leg portion 14a, but between the capacitor 30 and the terminal leg portion 14a. The same can be said to the other tubes. Accordingly, the tubes of the second embodiment can be maintained on the respective U-shaped terminal pins without any bonding agent.

It is to be noted that the noise filter of the second embodiment as shown in FIG. 7 has the same equivalent circuit as shown in FIG. 6.

Figure 8:
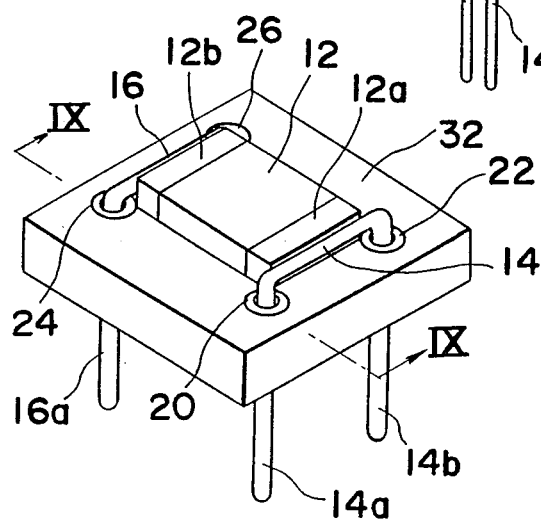
FIG. 8 is a perspective view of a noise filter defined by a 4-terminal capacitor according to a third embodiment of the present invention.
Figure 9:
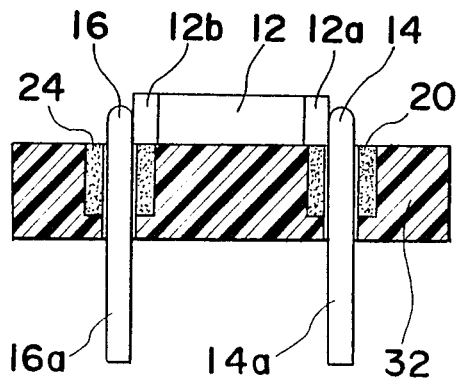
FIG. 9 is a cross-sectional view taken along a line IX—IX shown in FIG. 8.

Referring to FIGS. 8 and 9, a noise filter according to the third embodiment of the present invention is shown. The noise filter of the third embodiment has a structure similar to that of the first embodiment, but further has a synthetic resin block 32 for securing the tubes.

More particularly, the noise filter of the third embodiment comprises a chip shaped multi-layer capacitor 12 with electrodes 12a and 12b deposited at opposite ends. U-shaped terminal pins 14 and 16 are soldered to the electrodes 12a and 12b, respectively, with tubes 20, 22, 24 and 26 mounted on terminal legs 14a, 14b, 16a and 16b extending substantially downwardly and parallelly to each other. According to the preferred embodiment, the tubes are each made of a material having a high permeability and are previously molded in a synthetic resin block 32 and, thereafter, the capacitor 12 provided with the U-shaped terminal pins 14 and 16 is mounted on the synthetic resin block 32 in a manner shown in FIGS. 8 and 9. To fixedly hold the capacitor 12 on the synthetic resin block 32, a suitable bonding agent may be applied between the capacitor 12 and the synthetic resin block.

It is to be noted that the noise filter of the third embodiment as shown in FIGS. 8 and 9 also has the same equivalent circuit as shown in FIG. 6.

When in use, the noise filter according the first, second or third embodiment of the present invention is connected such that the U-shaped terminal pin 14 is connected in series with a ground line B, and the U-shaped terminal pin 16 is connected in series with a hot line A carrying signals, or power, as shown in FIG. 6.

According to the present invention, since inductances L16a and L16b are present in the hot line A, and inductances L14a and L14b are present in the ground line B, the noise signals in a wide frequency range can be filtered.

Furthermore, since each of such inductances L16a, L16b, L14a and L14b has a relatively high inductance, according to the present invention, the filtering effect, which is measured by the insertion loss of the noise filter in the filtering range, is greatly improved when compared with the prior art noise filter, as described later in connection with FIG. 15. In order to further improve the filtering effect, the noise filter of the following (fourth) embodiment may be used.

Figure 10:
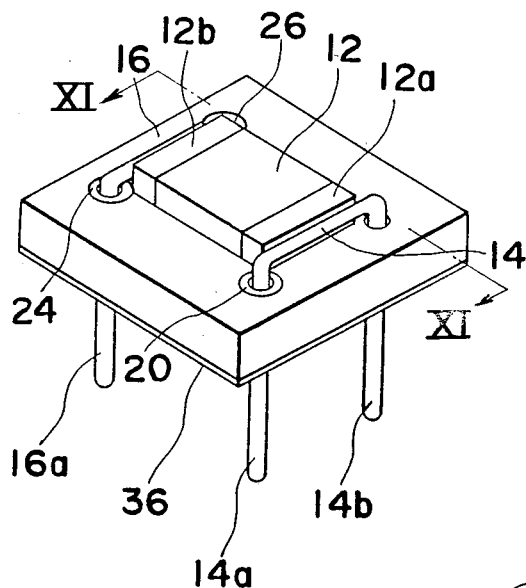
FIG. 10 is a perspective view of a noise filter defined by a 4-terminal capacitor according to a fourth embodiment of the present invention.
Figure 11:
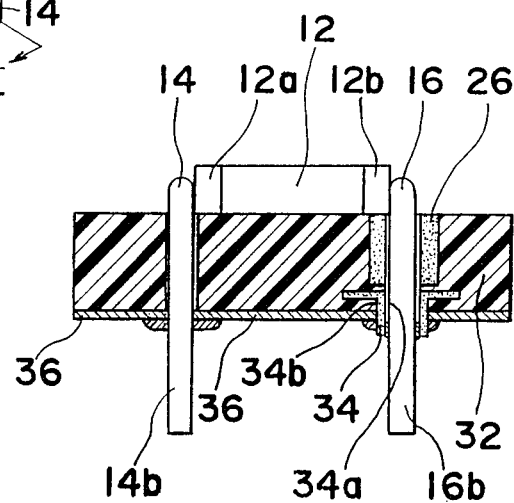
FIG. 11 is a cross-sectional view taken along a line XI—XI shown in FIG. 10.

Referring to FIGS. 10 and 11, a noise filter according to the fourth embodiment of the present invention is shown. When compared with the third embodiment shown in FIGS. 8 and 9, the noise filter of the fourth embodiment further comprises a feed through capacitor 34 mounted on a terminal leg 16b, and a plate 36 made of electrically conductive material, such as, for example, copper or brass. The plate 36 has four openings through which the four terminal legs extend, and the plate 36 is rigidly provided on a bottom face of the synthetic resin block 32, i.e., opposite to the face mounted with the capacitor 12. The feed through capacitor 34 is defined by a cylindrical body having an inner face and an outer face. The inner face is provided with an inner electrode 34a which is soldered to the terminal leg 16b, and the outer face is provided with an outer electrode 34b which is soldered to the plate 36. The electrodes 34a and 34b are electrically insulated from each other. Furthermore, the terminal leg 14b is soldered to the plate 36. It is to be noted that the other terminal legs 14a and 16a are electrically insulated from the plate 36 by a suitable space (not shown) provided therebetween. Furthermore, according to the fourth embodiment, no tube is mounted on the terminal leg 14b. The purpose of this is to reduce influence of the undesirable common mode noise signals.

According to the preferred embodiment, the feed through capacitor 34 is previously molded in the synthetic resin block 32 in coaxial alignment with the tube 26 and, thereafter, the capacitor 12 provided with the U-shaped terminal pins 14 and 16 is mounted on the synthetic resin block 32 in a manner shown in FIGS. 10 and 11.

Figure 12:
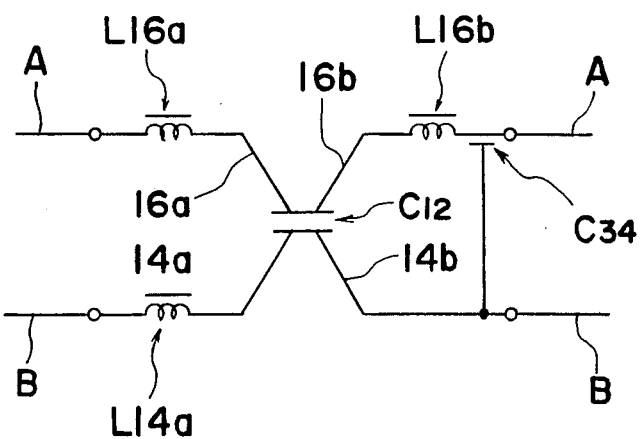
FIG. 12 is an equivalent circuit of the 4-terminal capacitor of the fourth embodiment.

Referring to FIG. 12, an equivalent circuit of the noise filter of the fourth embodiment is shown. In FIG. 12, a capacitor C34 represents a capacitance between the electrodes 34a and 34b.

When in use, the U-shaped terminal pin 14 is connected in series with a ground line B, and the U-shaped terminal pin 16 is connected in series with a hot line A carrying signals, or power, as shown in FIG. 12.

Figure 16:
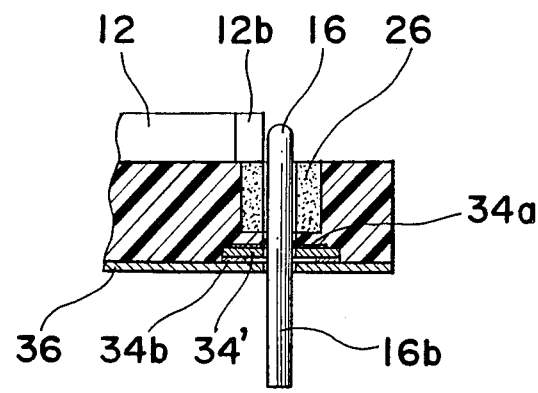
FIG. 16 is a fragmentary view showing a modification of a feed through capacitor.

Referring to FIG. 16, there is shown a modified feed through capacitor 34' defined by a disc shaped body with a center opening, an upper electrode 34a' deposited on one flat surface of the disc shaped body and a bottom electrode 34b' deposited on the other flat surface thereof. The disc shaped feed through capacitor 34' is mounted on the terminal leg 16b and positioned between the tube 26 and the plate 36. The upper electrode 34a is soldered to the terminal leg 16b and the bottom electrode 34b is soldered to the plate 36.

Figure 17:
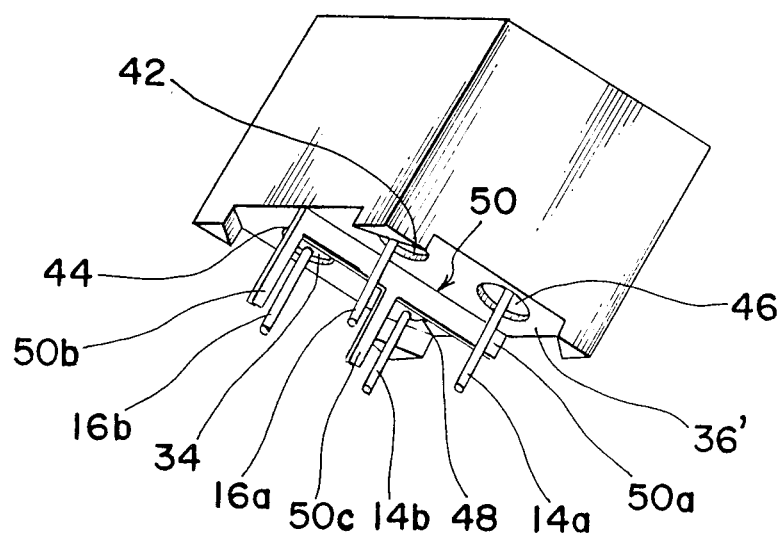
FIG. 17 is a perspective view of a noise filter defined by a 4-terminal capacitor according to a fifth embodiment of the present invention.
Figure 18:
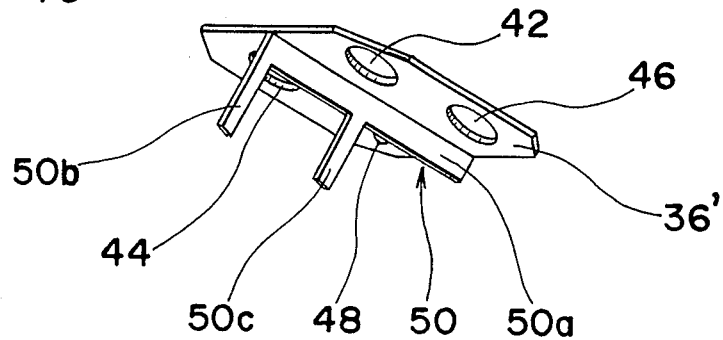
FIG. 18 is a perspective view of a plate mounted with a shield plate.
Figure 19:
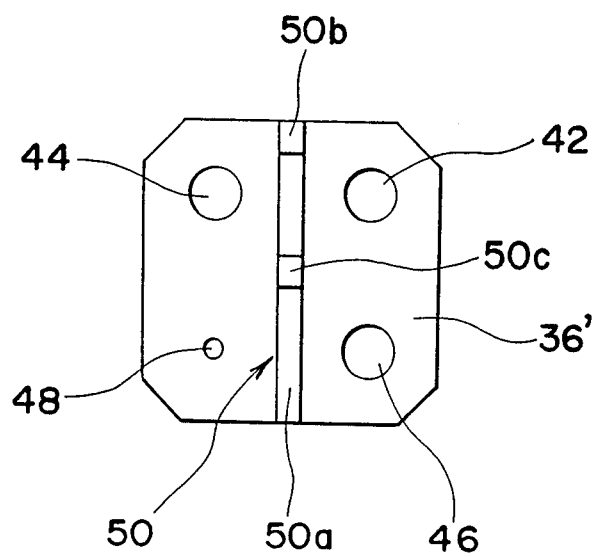
FIG. 19 is a bottom plan view of a plate shown in FIG. 18.

Referring to FIGS. 17 to 19, a noise filter according to the fifth embodiment of the present invention is shown. When compared with the fourth embodiment shown in FIGS. 10 and 11, the noise filter of the fifth embodiment further comprises a shield plate 50 provided on the plate 36. The shield plate 50 is defined by an elongated plate portion 50a and arm portions 50b and 50c extending perpendicularly from the elongated plate portion 50a in a shape of "F". The elongated plate portion 50a, serving as a wall member, extends across the center of the plate 36' as best shown in FIG. 19, to separate the plate 36' into a right-hand half and a left-hand half. In the right-hand half, the plate 36' is formed with openings 42 and 46 for receiving the terminal legs 16a and 14a, respectively. And, in the left-hand half, the plate 36' is formed with openings 44 and 48 for receiving the terminal legs 16b and 14b, respectively. Accordingly, the terminal legs 14a and 14b are electrostatically shielded from each other, and the terminal legs 16a and 16b are also electrostatically shielded from each other.

Preferably, the arms 50b and 50c extend at such positions that an imaginary line between the centers of the arms 50b and 50c intercepts an imaginary line between the centers of the openings 42 and 44. When in use, the arms 50b and 50c are connected to ground.

By the employment of the shield plate 50, each input terminal leg 16a or 14a is shielded from the output terminal leg 16b or 14b, an electrostatic coupling caused by the stray capacitance can be minimized, thereby cutting the propagation of noise signals.

Figure 20:
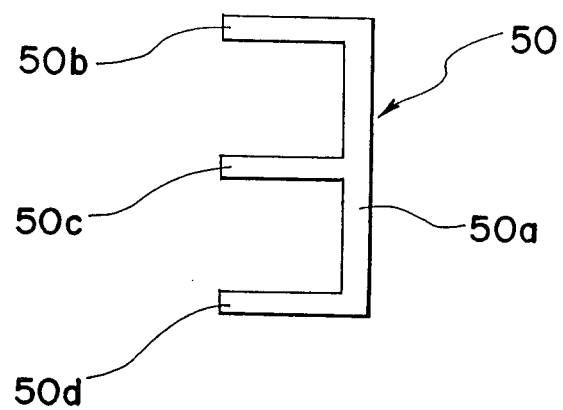
FIG. 20 is a side view of shield plate according to one modification.

It is to be noted that the shield plate 50 can be formed in a shape of "E", as shown in FIG. 20, with three arms 50b, 50c and 50d.

It is also to be noted that the noise filter of anyone of the preceding embodiments can be accommodated in a casing, such as shown in FIG. 17.

According to the first to third embodiments, the noise signals in a wide frequency range can be filtered with a high filtering effect. However, because of a small inductance appearing within the electrodes 12a and 12b of the multi-layer capacitor 12, there may be an undesirable resonance produced by such a small inductance and the capacitor 12. Such a resonance, particularly when it is in a high frequency region, reduces the filtering effect. According to the fourth and fifth embodiments, such a resonance can be suppressed by the employment of the feed through capacitor 34. Therefore, the filtering effect is further improved.

It is to be noted that, in the case where each of the inductances L14a, L14b, L16a and L16b is relatively small, such a resonance will not take place and, therefore, it is not necessary to provide the feed through capacitor 34.

Next, the tests carried out by the present inventor are described.

Figure 13:
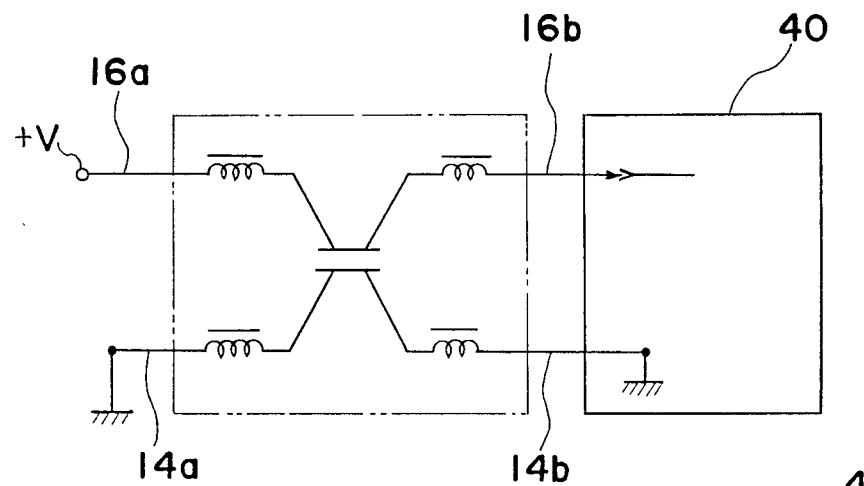
FIG. 13 is a circuit diagram showing a connection for testing the insertion loss of the noise filter of the present invention.
Figure 14:
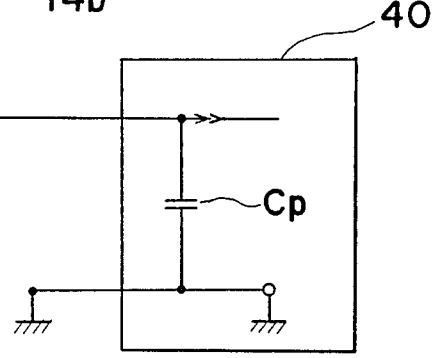
FIG. 14 is a circuit diagram showing a connection for testing the insertion loss of the noise filter of prior art employing a 2-terminal capacitor.

As shown in FIG. 13, the first test is carried out by connecting the noise filter of the first embodiment employing 1 microfarad multi-layer capacitor 12 to a test circuit such that the terminal leg 16a is connected to a power source +V, the terminal leg 14a is connected the ground of the power source, the terminal leg 16b is connected to an electronic device 40, and the terminal leg 14b is connected to the ground of the electronic device 40. The electronic device 40 is capable of measuring insertion loss of the noise filter at different frequencies. The second test is carried out by replacing the noise filter of the third embodiment with the noise filter of the fourth embodiment employing 1 microfarad multi-layer capacitor 12 and 3300 picofarad feed through capacitor 34. And, as shown in FIG. 14, the third test is carried out by replacing the noise filter of the fourth embodiment with the noise filter of the prior art including, for example, a capacitor Cp having a capacitance of 1 microfarad.

Figure 15:
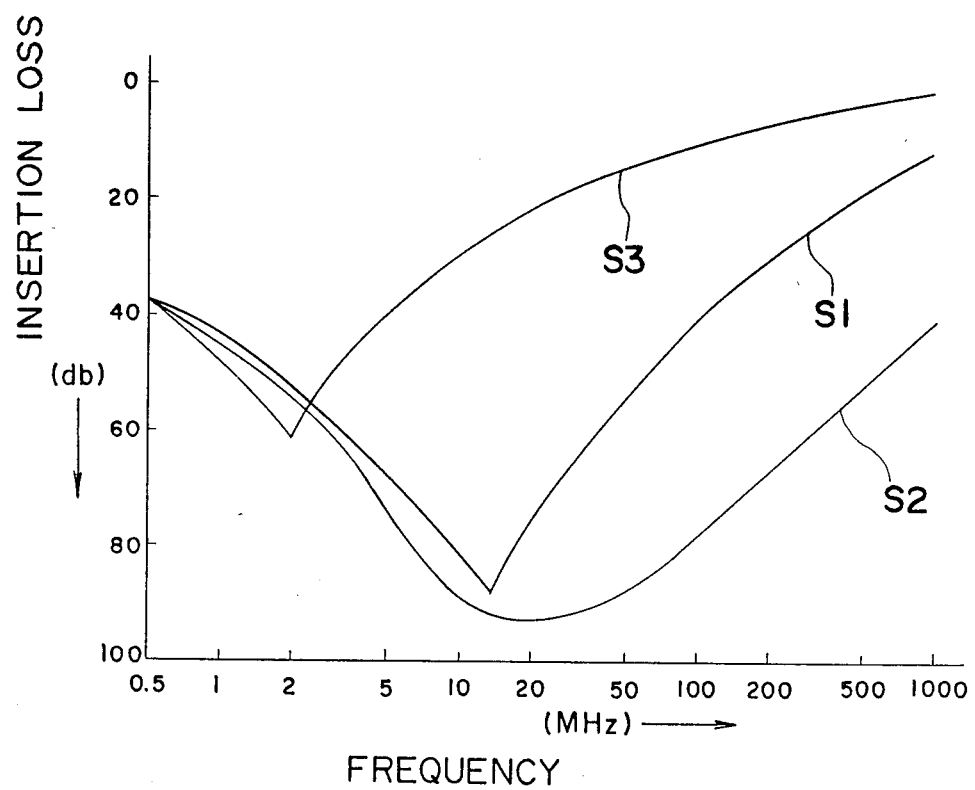
FIG. 15 is a graph showing relation between the insertion loss and frequency.

The results of the tests are shown in the graph of FIG. 15 in which abscissa and ordinate represent frequency and insertion loss, respectively. In the graph of FIG. 15, a curve S1 shows the result of the first test using the noise filter of the first embodiment of the present invention. When compared with the curve S3 showing a test result of the prior art, the curve S1 has a greater insertion loss in a high frequency region. Particularly in a frequency region between 0.8 MHz and 100 MHz, the curve S1 shows that the insertion loss is greater than 40 db, that is, when measured by a voltage ratio, more than 1/100.

Also, in the graph of FIG. 15, a curve S2 shows the result of the second test using the noise filter of the fourth embodiment. This curve S2 shows that the insertion loss is further improved such that in a frequency region between 8 MHz and 100 MHz, the insertion loss is greater than 80 db, that is, when measured by a voltage ratio, more than 1/10000.

Although the curve S1 shows the result of the test using the noise filter of the first embodiment, the same result is obtained when noise filter of the second or third embodiment is employed.

Also, although the curve S2 shows the result of the test using the noise filter of the fourth embodiment, the same result is obtained when noise filter of the fifth embodiment is employed.

In the previous embodiments the multi-layer capacitor 12 can be replaced with any other known type of capacitor.

Also, according to the first, second and third embodiments shown in FIGS. 5 to 9, it is not necessary to mount the tube on all the terminal legs, but only at least on one of the four terminal legs.

Furthermore, according to the fourth and fifth embodiments, as shown in FIGS. 10 to 12 and in FIGS. 17 and 18, having a feed through capacitor 34, the tube should be mounted at least on the terminal leg 16b, which is further mounted with the feed through capacitor 34.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of appended claims.

What is claimed is:

1. A noise filter, comprising:
   a capacitor having first and second electrodes;
   first and second terminal legs extending from said first electrode, said first and second terminal legs being electrically coupled to one another;
   third and fourth terminal legs extending from said second electrode, said third and fourth terminal legs being electrically coupled to one another;
   a tube made of magnetic material being mounted on one of said terminal legs whereby when an electric signal is applied to said first terminal leg and said third terminal leg is connected to ground, high frequency noise signals contained in said electric signal are filtered; and
   a feed through capacitor having first and second electrodes, said feed through capacitor being mounted on said second terminal leg, said first electrode of said feed through capacitor being electrically connected to said second terminal leg and said second electrode of said feed through capacitor being electrically connected to one of said third and fourth terminal legs.

2. A noise filter, comprising:
   a capacitor having first and second electrodes;
   first and second terminal legs extending from said first electrode, said first and second terminal legs being electrically coupled to one another;
   third and fourth terminal legs extending from said second electrode, said third and fourth terminal legs being electrically coupled to one another;
   first and second tube means mounted on said first and second terminal legs, respectively, each of said first and second tube means being made of a magnetic material, whereby when an electric signal is applied to said first terminal leg and said third terminal leg is grounded, high frequency noise signals contained in said electric signal are filtered; and
   a feed through capacitor having first and second electrodes, said feed through capacitor being mounted on said second terminal leg, said first electrode of said feed through capacitor being electrically connected to said second terminal leg and said second electrode of said feed through capacitor being electrically connected to one of said third and fourth terminal legs.

3. A noise filter as claimed in claim 2, further comprising third and fourth tube means mounted on said third and fourth terminal legs, respectively, each of said third and fourth tube means being made of a magnetic material.

4. A noise filter as claimed in claim 2, wherein said first and second terminal legs are defined by a first terminal pin having its intermediate portion connected to said first electrode.

5. A noise filter as claimed in claim 2, wherein said third and fourth terminal legs are defined by a second terminal pin having its intermediate portion connected to said second electrode.

6. A noise filter as claimed in claim 2, wherein said feed through capacitor is defined by a cylindrical body having an inner face and an outer face, said first electrode of said feed through capacitor being located on said inner face and said second electrode of said feed through capacitor being located on said outer face.

7. A noise filter as claimed in claim 2, wherein said feed through capacitor is defined by a disc shaped body having first and second opposite flat surfaces, said first electrode of said feed through capacitor being located on said first flat surface and said second electrode of said feed through capacitor being located on said second flat surface.

8. A noise filter as claimed in claim 2, further comprising a plate made of electrically conductive material for effecting an electric connection between said second electrode of said feed through capacitor and one of said third and fourth terminal legs.

9. A noise filter as claimed in claim 8, further comprising a shield member mounted on said plate member for effecting an electrostatic shield between said first and second terminal legs.

10. A noise filter as claimed in claim 9, wherein said shield member is in the shape of an "F".

11. A noise filter as claimed in claim 9, wherein said shield member is in the shape of an "E".

12. A noise filter comprising:
    a capacitor having first and second electrodes;
    first and second terminal legs extending from said first electrode, said first and second terminal legs being electrically coupled to one another;
    third and fourth terminal legs extending from said second electrode, said third and fourth terminal legs being electrically coupled to one another;
    first, second and third tube means mounted on said first, second and third terminal legs, respectively, each of said tube means being made of a magnetic material whereby when an electric signal is applied to said first terminal leg and said third terminal leg is grounded, high frequency noise signals contained in said electric signal are filtered; and
    a feed through capacitor having first and second electrodes, said feed through capacitor being mounted near said second terminal leg, said first electrode of said feed through capacitor being electrically connected to said second terminal leg and said second electrode of said feed through capacitor being electrically connected to one of said third and fourth terminal legs.

13. A noise filter as claimed in claim 12, further comprising an electrically non-conductive block for supporting said first, second, third and fourth tube means, and also said feed through capacitor.

14. A noise filter according to claim 14, wherein said third terminal leg is grounded.

15. A noise filter according to claim 12, further comprising an electrically non-conductive block hook supporting said first, second and third tube means.

16. A noise filter as claimed in claim 12, wherein said first and second terminal legs are defined by a first terminal pin having its intermediate portion connected to said first electrode.

17. A noise filter as claimed in claim 12, wherein said third and fourth terminal legs are defined by a second terminal pin having its intermediate portion connected to said second electrode.

18. A noise filter as claimed in claim 12, wherein said feed through capacitor is defined by a cylindrical body having an inner face and as outer face, said first electrode of said feed through capacitor being located on said inner face and said second electrode of said feed through capacitor being located on said outer face.

19. A noise filter as claimed in claim 12, wherein said feed through capacitor is defined by a disc shaped body having first and second opposite flat surfaces, said first electrode of said feed through capacitor being located on said first flat surface and said second electrode of said feed through capacitor being located on said second flat surface.

20. A noise filter as claimed in claim 12, further comprising a plate made of electrically conductive material for effecting an electric connection between said second electrode of said feed through capacitor and one of said third and fourth terminal legs.

21. A noise filter as claimed in claim 20, further comprising a shield member mounted on said plate member for effecting an electrostatic shield between said first and second terminal legs.

22. A noise filter as claimed in claim 21, wherein said shield member is in the shape of an "F".

23. A noise filter as claimed in claim 21, wherein said shield member is in the shape of an "E".

* * * * *